April 26, 1955 F. DOSTAL 2,707,234

TUNING FORK OSCILLATORS

Filed Aug. 22, 1952 4 Sheets-Sheet 1

Frank Dostal
INVENTOR

April 26, 1955 F. DOSTAL 2,707,234

TUNING FORK OSCILLATORS

Filed Aug. 22, 1952

4 Sheets-Sheet 2

Frank Dostal
INVENTOR

Frank Dostal
INVENTOR

Frank Dostal
INVENTOR

United States Patent Office 2,707,234

Patented Apr. 26, 1955

2,707,234

TUNING FORK OSCILLATORS

Frank Dostal, Great Neck, N. Y., assignor to American Time Products, Inc., New York, N. Y., a corporation of Delaware Application August 22, 1952, Serial No. 305,827

5 Claims. (Cl. 250—36)

The instant invention relates to electrically driven vibrators for generating electric current of fixed frequency, and particularly to electrically driven tuning forks.

An object of the invention is to provide an accurate frequency source in a compact form.

Another object of this invention is the stabilization of the frequency of tuning fork controlled audio frequency generators of which the elements are of the lowest weight and smallest size and are protected to the greatest possible degree from their environment, and changes in temperature thereof, by hermetically sealing the tuning fork and at least those of the electric circuit elements matched to the fork, and in certain cases all circuit elements, in an enclosure.

Still a further object of the invention is to provide a compact light weight, and small dimensioned, frequency generator assembly which is readily connected to the work circuits employing the frequency generated, as, for example, by mounting on a base having fixed external terminals permitting plugging in of the generator in the manner well known for commercial thermionic tubes.

Still a further object of the invention is to provide heating means for the tuning fork positioned as close as practicable to the fork for assuring a flat uniform response of the tuning fork over a wide range of temperature above a minimum in a minimum heat-up time.

Still a further object is to mount the tuning fork and such of the circuit elements as are positioned within the hermetically sealed enclosure resiliently from a frame within the enclosure so that all risk of short circuit, and changes in the electrical constants of the circuit due to changes in the relative position of components, are substantially eliminated even on subjecting the generator to severe sectional vibration and shock.

The foregoing, and other, objects will appear from the following description of two illustrative embodiments of my invention with the aid of the appended drawings in which.

Figure 1B:
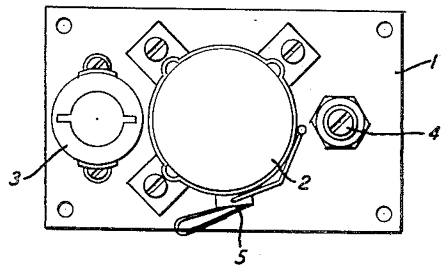
Figures 1A and 1B are a vertical, respectively top, external view of the assembled tuning fork oscillator with the amplifier tube of the electrical circuit external to the housing for the tuning fork and the circuit elements selected to match the specific fork in the manufacturing and calibrating processes.
Figure 1A:
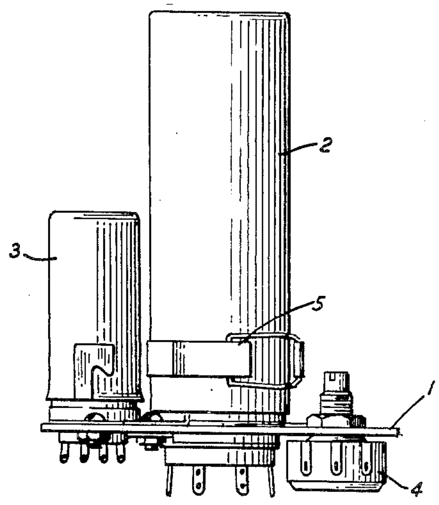

Referring to the illustrative embodiment of the tuning fork oscillator shown in Figures 1A and 1B, a base 1 supports the fork housing 2 and the thermionic tube 3 in upright position thereon, the housing being substantially central, the base and the thermionic tube to one side thereof. Also supported on the base and to the side thereof opposite the tube 3 and extending downwardly from the base is the linear control rheostat 4, the function of which will be described later in describing the circuit. The lower region of housing 2 is conveniently clamped to the base by a circular spring clamp 5 integrally attached to the base 1.

Figure 2:
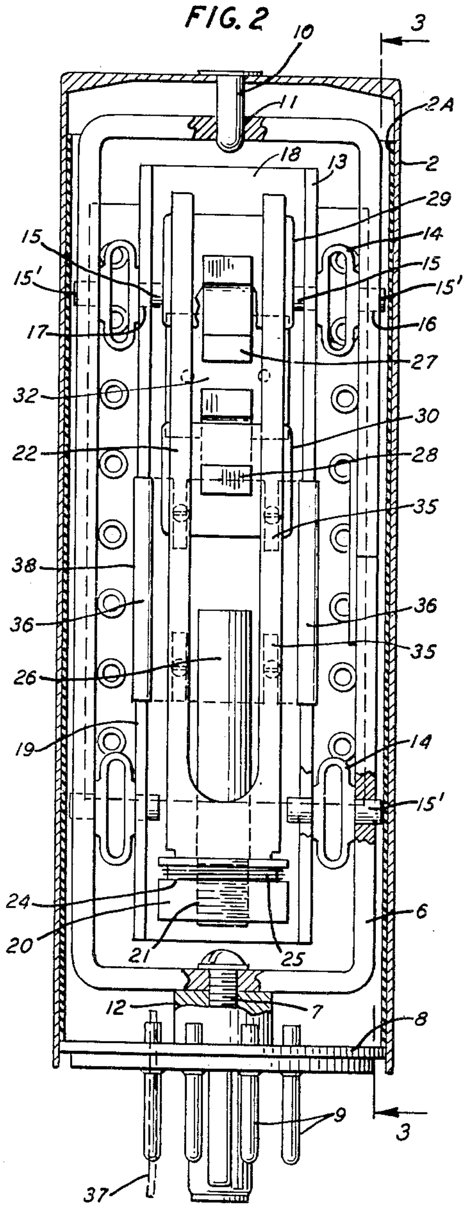
Figure 2 is a vertical sectional view of the assembly within the fork housing of Figure 1, viewed from the tuning fork side thereof.
Figure 3:
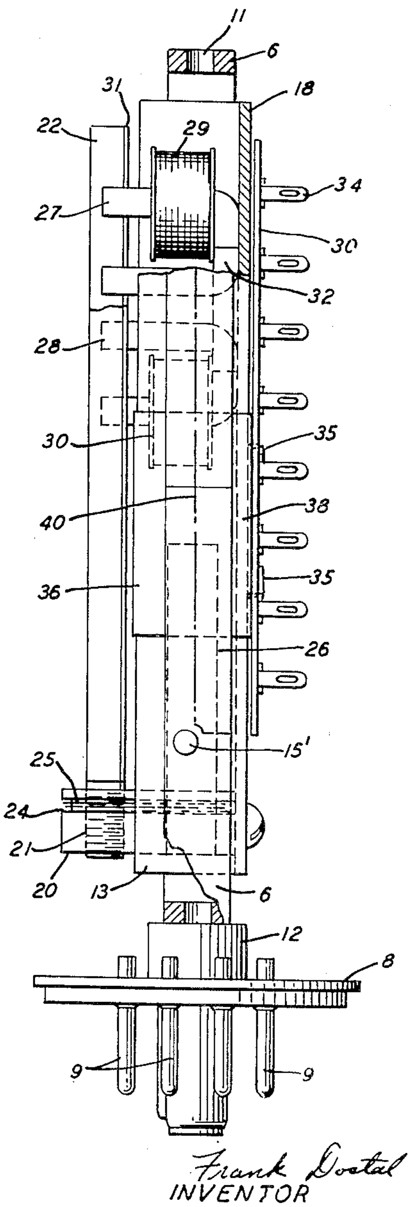
Figure 3 is a section along line 3—3 of Figure 2 with the housing removed and without any circuit elements attached to the component board in order to facilitate understanding of the mechanical assembly.

Within the housing, as shown in Figures 2 and 3, a rectangular frame 6 of flat metal bent edgewise is rigidly supported at its bottom by the screw 7 extending from the casing bottom 8, through which the terminal pins 9 extend for respective electrical connection within the housing and externally thereto. The housing 2 is preferably cylindrical and open at its lower end while closed at its upper end, the bottom 8 fitting snugly into the open lower end and being soldered thereto after all the parts to be housed within the casing have been properly assembled, mounted and tested. To furnish a rigid support at the upper end of the frame 6, the upper closed end of the housing 2 has an inwardly extending pin 10 adapted, on appropriate assembly of the casing and frame, to engage bore 11 in the upper arm of frame 6. Spacer ring 12, positioned about supporting screw 7, positions the frame vertically with respect to bottom 8, the external dimensions of the preferably rectangular frame 6 being such that the frame is thus supported with every portion thereof having a relatively substantial clearance from the inner surface of housing 2.

A U-shaped channel or cradle 13 of light weight material such as aluminum, is resiliently suspended within the frame 6 by means of a plurality, for example four as shown in Figure 2, of rubber grommets or shock absorbers 14. The latter are preferably of silicone rubber because of their inherent long life and resistance to high temperatures, and are essentially sections of tubing having integral diametrically opposed extensions, 15 and 15', adapted snugly to fit into bores 16 and 17, respectively, of frame 6 and channel 13.

Channel 13, of a length less than the longest internal dimension of frame 6, has a bottom 18 with two integral lateral flanges 19 extending in the same direction to form a U-shape. Near the lower, as mounted in frame 6, end of the channel bottom 18 a block member 20 is affixed thereto and is provided with, for example, a threaded bore 21 in the portion thereof extending beyond the free edges of flanges 19, in which bore the threaded base end of the tuning fork 22 is mounted and locked. In place of the bore 21 any other convenient means, for example a clamping slot, may be used rigidly to mount the fork 22 in member 20, so that the fork extends substantially parallel to and above the upper free edges of flanges 19 and centrally between them. Block member 20 has a groove 24 about its periphery in which a heating coil 25 is positioned. Block 20 is preferably of a light weight metal, for example of aluminum, which is a good conductor of heat so that the heat generated by the coil 25 on application of an electrical potential thereto is readily conducted to the tuning fork. A thermostat 26 is supported on block member 20 in the region thereof between the tuning fork 22 and the bottom 18 of the channel and is electrically in series with the heating coil 25. The thermostat 26 may be of any known kind, and is adjusted to close the circuit of coil 25 when the temperature of the fork is below that for which the fork is accurately of the predetermined frequency, for example 20 degrees C., and to open the coil circuit just as soon as such temperature is reached by the fork.

The tuning fork 22 has tines of rectangular cross section in the space between which the magnets 27 and 28 of the driving coil 29, respectively, the pick-up coil 30 project. The inner face, that is the face toward channel bottom 18, of the tuning fork, for example, has an integral layer 31 of a metal different from the metal of the body of the fork, the two metals being selected for their mutually compensating thermal properties and in such relative amounts that frequency deviation due to temperature changes are substantially eliminated. For example, the body of the tuning fork is of chromium nickel steel and layer 31 is of a tool steel.

The temperature compensation characteristic so obtained can be made flat for only a selected portion of possible ambient temperatures. For example, as shown by the solid curve in Figure 8, the response is within limits of ±15 parts per million in the range from 0 to 85 degrees C. However, at temperatures such as −60 degrees C., the rate departs by 200 parts per million from normal. For many indoor applications this is eminently satisfactory; however, in military applications, specifically in aircraft, the temperature range over which high accuracy is required may be from −65 degrees C. to +85 degrees C.

To substantially improve the response at temperatures below 0° C., the heater coil 25 is installed in groove 24 about member 20, as above stated. When power of the order of 10 watts is applied to the coil by the operation of thermostat 26, the fork is rapidly brought up to a temperature greater than 10° C. If the fork temperature becomes greater than this, or even if a substantial temperature gradient exists along the fork, the accuracy of the frequency response is thus substantially improved as shown by the dashed portion of the curve of Figure 8. When thermal equilibrium exists in the coil 25, member 20, fork 22 and associated parts, the thermostat 26 will cut off the current. The time required for establishing thermal equilibrium is of relative short duration, being some 12 minutes with a starting temperature of −65° C., some 8 minutes for such temperature of −40° C., and about 4 to 6 minutes for such temperatures of −15° C., as shown by the graphs of Figure 9.

The great advantage of such arrangement is that since a fork can be made to have a substantially flat response for the temperature range of from, for example 0° C., to 80° C., the accuracy and stability of the thermal control need not be great. For such reason likewise the existence of a temperature gradient along the fork within this range is not important, extensive design and experiment is avoided in the proper location of the members having to do with the heating, and the heating rate can, and is, readily made large as above given.

Each of the mass produced tuning forks is initially tested for temperature-frequency response, and in accordance with such test, more of the body material or of the layer material of the particular tuning fork is removed until the desired precise frequency with thermal compensation is obtained.

The magnets 27 and 28 are U-shaped bars of a highly magnetic material or alloy, the bottom of the U being affixed to the channel bottom 18 in any well known manner, for example by an H-shaped bracket 32 of non-magnetic material, such as brass, into the openings of which H the respective magnets are a tight fit and soldered, the bracket 32 being affixed to the channel bottom 18 by a pair of bolts, for example. Coils 29 and 30 are wound about the outermost, as affixed to the channel, leg of magnet 27, respectively magnet 28, and are of such dimension that in the assembled position they fit wholly within the channel 13 below the layer 31 of the tuning fork 22. By so positioning each coil about the outermost leg of its magnet, the two magnets are brought into the closest spatial relationship, while by having the poles of the magnets extend betwen the tines of the fork, the assembly with the tuning fork requires a minimum of space.

Component board 33 is of a width dimension substantially equal to the width dimension of the frame 6 and of a length dimension somewhat less than that of channel 13, and is of insulating material, for example one having a fabric or glass base. Along both its longitudinal edges it is provided with a plurality, for example eight, of preferably equally spaced eyelet terminals 34 to which various of the electrical circuit elements are connected and are thereby supported, the eyelets permitting the passage of connecting wires as required from the elements to, for example, coils 29 and 30 through perforations in the channel bottom 18. A formed bracket 38, of readily bendable thin metal, for example brass, has two pairs of projections 35 which pass through a convenient portion of board 33 and are then bent over to engage the surface of the board, and another pair of projections 36 extending in the opposite direction which are bent over the respective adjacent flanges 19 of channel 13, thus affixing the board to the channel. Connecting wires from such of the circuit elements as require external connection are soldered to the respective terminals 9 of housing bottom 8. To prevent any accidental electrical shorts between the portions of the eyelet terminals 34 on the face of the board facing the frame 6, the portions of frame 6 adjacent the board may be of insulating material such as shown by the portion indicated by the dashed line 40 in Figure 3. Similarly to prevent any accidental shorts between any of the electrical elements and the metal housing 2, a cylindrical liner 2*a* of insulating material of thin width is snugly fitted to the inner surface of housing 2.

In the manufacture, a metal tube 37 (Figure 2) is preferably passed through the casing bottom 8. After the tuning fork assembly has been sealed by soldering housing 2 to casing bottom 8, the tube 37 is used to exhaust the interior of the housing and is then sealed off, whereby predetermined conditions prevail as to the atmosphere about the tuning fork, thus minimizing possible variations in the fork frequency due to changes in the character of the atmosphere enveloping the fork.

Figure 5:
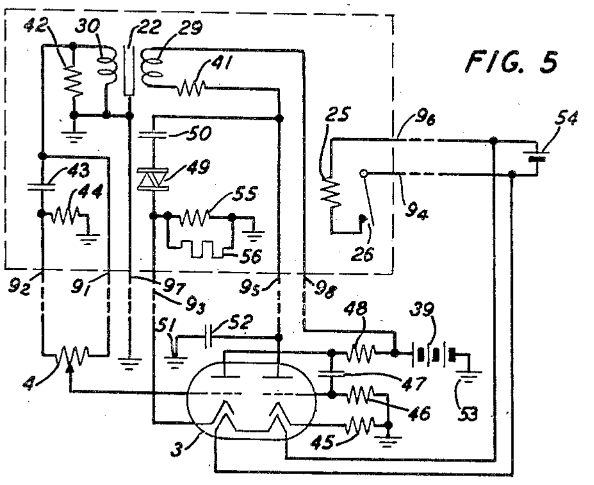
Figure 5 is a circuit schematic of the tuning fork oscillator of the one embodiment of which the component board is shown in Figure 4.

Referring now to the electrical circuit schematic of Figure 5, one side of the driving coil is connected through a series resistance 41 to the plate of the output stage of double triode 3, the other side of the driving coil being connected to the positive side of the potential source 39, of which the negative side is grounded. The direction of winding of coil 29 relative the polarity of magnet 27 is such that the plate current tends to reduce the magnetic flux in the magnet, thus providing substantial compensation in the frequency-plate voltage response. Normally in a fork circuit, at low plate voltages supplied to the driving coil thereof, the fork frequency is higher or increases as shown in curve A of Figure 10. In the instant fork circuit, at higher plate voltages with resulting increased current flowing in coil 29, the effective magnetic force is less and the fork frequency is higher than normal; while at low plate voltages and hence decreased current flow in the coil, the frequency is lower than otherwise as shown by curve B of Figure 10.

Pick-up coil 30 is shunted by resistor 42 to avoid a parasitic tuned circuit and is connected to the fixed phase network comprising capacitance 43 and resistor 44 and to one side of the control resistor 4. Coil 30 is also connected directly to the other terminal of control resistor 4, with the variable contact slider of the control resistor being connected to the grid of the input triode of tube 3. Cathode bias resistor 45 is connected to the cathode of the output triode, grid leak 46 to the control grid thereof, while blocking condenser 47 is inserted between the control grid of the output triode and the plate of the input triode. Potential is applied from source 39 to the plate of the input triode through resistor 48. The constant control feature of the circuit is provided by the varistor 49 in series with the capacitance 50 connecting the plate of the output triode to the cathode of the input triode, and forming a negative feedback path which with increasing voltage output decreases the amplification in the input triode, thus stabilizing the electrical energy supplied to driving coil 29. Resistor 55 and thermistor 56 in shunt thereto together have a temperature response complementary to the temperature response of varistor 49. Essentially resistor 55 and thermistor 56 in shunt thereto also are the ratio arm of the negative feedback net comprising varistor 49, capacitor 50, resistor 55 and thermistor 56. The varistor accomplishes stability in the fork despite gain changes due to B voltage changes or changes in the magnitudes of circuit elements, while the thermistor 56 provides correction for the undesired temperature response of the varistor 49.

Output terminals of the oscillator are respectively the terminal 51, connected through blocking capacitance 52 to the plate of the output triode of tube 3, and terminal 53, connected to the grounded side of source 39. Potential for the heaters for the cathodes of the two triodes of tube 3 is supplied from the source 54, which preferably also supplies potential to the coil 25 for heating the tuning fork.

Figure 4:
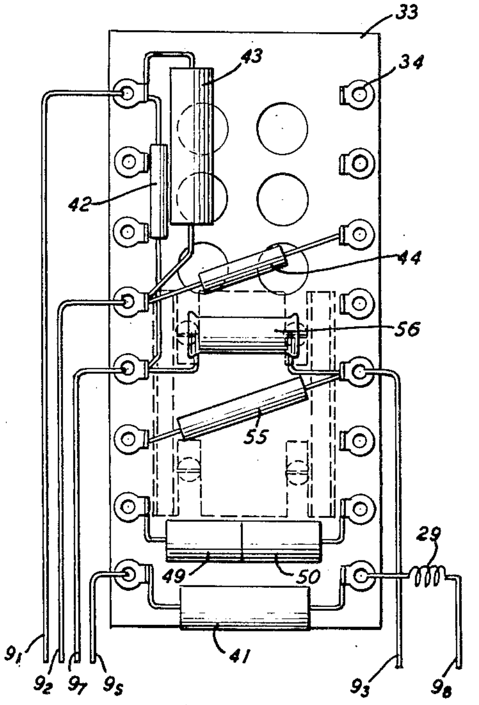
Figure 4 is a plan view of the component supporting face of the component board of one illustrative embodiment of my invention.

The elements enclosed in the dashed rectangle of Figure 5 are, in the actual first illustrative embodiment, those enclosed within the housing 2, with the equipment board 33 having mounted thereon as shown in Figure 4, capacitances 43 and 50, resistors 41, 42, 55 and 56, and the varistor 49. The respective terminals 9 through which the electrical connections are made to elements external the tube are shown in Figure 5 immediately below the lower line and to the right of the right line of the dashed rectangle, and are each identified by the subscript corresponding to the numerical sequence of the terminal clockwise from the bayonet of the octal socket as viewed from the bottom. It is to be understood that the dashed portions of the connecting lines through the terminals $9_1$, $9_2$, . . . $9_8$ are in fact continuous lines, the dashed portions merely indicating they are severable thereat by removing casing 2 from the base 1. Similarly the dashed portions of the connections in Figure 7 indicate continuous but severable connections extending through the terminals 9 of the second illustrative embodiment below described.

Figure 6:
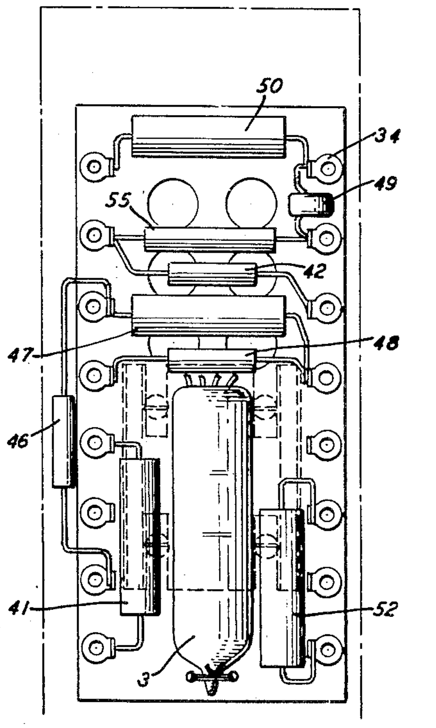
Figure 6 is a plan view of the component supporting face of the component board of the second illustrative embodiment of my invention in which all the circuit elements, including the amplifier tube but excepting the potential sources, are disposed within the tuning fork housing.

As to such applications wherein the tuning fork oscillator is required to have assurance as to constancy of its predetermined characteristics for but a limited number of actual operations thereof in ultimate use, all the components of the electrical circuit, other than the potential sources, may readily be enclosed in the housing 2. In such embodiment, all the circuit elements, except the driving, pick-up and fork heating coils are mounted on the component board as shown in Figure 6, in which like reference characters designate like elements as in Figures 1A to 5 inclusive, the other essential features of this second illustrative embodiment being unchanged from those shown in Figures 2 and 3 in respect of the first illustrative embodiment. As will be noted from the circuit schematic of Figure 7 of this second embodiment, the linear control resistor 4 as well as the thermistor 56 are omitted in the circuit which, however, retains all the other elements of the circuit of the first embodiment.

Figure 7:
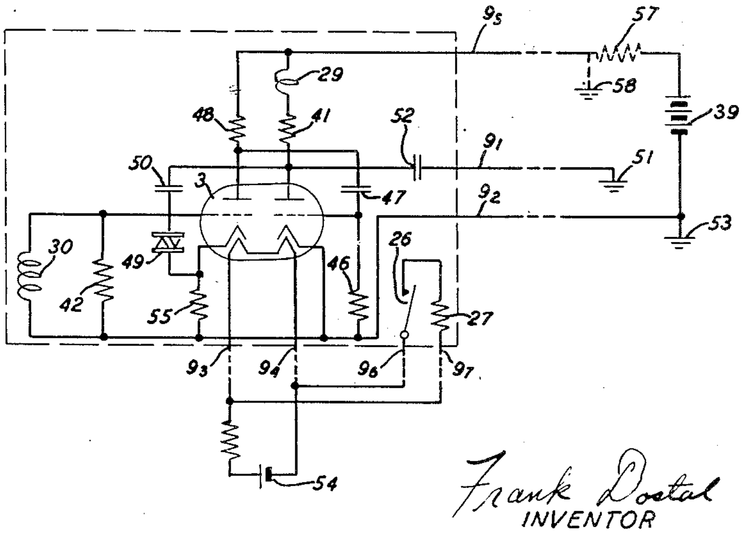
Figure 7 is the circuit schematic of the second illustrative embodiment of which the component board is shown in Figure 6.

Referring particularly to the circuit schematics of Figures 5 and 7, vibrations of the fork 22 generate an electromotive force in the pick-up coil 30 which is applied to the grid of the input triode of tube 3. In the circuit of the first embodiment the variable resistor 4 may be used linearly to control the relative phase of this E. M. F. at a rate permitting of variations in the fork frequency of the order of 100 parts per million. The impressed E. M. F. is amplified in the input triode and, through capacitance 47 is impressed so amplified on the grid of the output triode, the amplified output being impressed from the plate of the output triode on the driving coil 29. Another path which the amplified potential from the plate of the output stage triode may take is the feedback path shunted across such plate through capacitance 50 and varistor 49 to the cathode of the input stage triode. The respective magnitudes of the capacitance 50 and the varistor 49 are such that for the current of the magnitude corresponding to the proper vibration of the tuning fork, both as to frequency and amplitude, flowing from the plate of the output triode, a portion will flow in the feedback path, and so on any variation therefrom the current flowing through the feedback path will correspondingly vary. Since the phase of the current flowing in the feedback path is reversed with respect to that flowing to the input stage triode grid from the pick-up coil, the changed feedback current will compensate such variation by oppositely adjusting the amplification gain of the triodes and thus stabilize at the proper magnitude the current flowing to the driving coil.

As is known, the resistance of varistors varies inversely with the voltage, not necessarily as the first power of the applied voltage but as a power greater than 1, for example as the square of a higher power. When the fork starts to vibrate, the resistance in the feedback path due to the varistor 49 is at a maximum permitting full gain to obtain in the amplifier circuit. As the vibrations of the fork build up, the voltage across the varistor builds up and accordingly its resistance rapidly decreases to the steady state, causing the gain of the circuit and the amplitude of the fork to achieve a stable level relatively quickly. Not only does the varistor so respond to applied voltage, but as an unwanted feature in this application, also to thermal changes. Hence in the first embodiment, the thermistor 56 is included in shunt with the resistance 55 and changes its resistance with temperature so as to substantially compensate for the changes taking place in the varistor. In place of the varistor which gives an excellently short build-up time, an invariable resistor may be used with, however, the attendant disadvantage of a relatively long build-up time and poorer fork amplitude stability. In the instant fork application of the circuit, the varistor is preferable because of the resulting short build-up time and the excellent stability of fork amplitude obtained, even though the wave shape may not be as good as when an invariable resistor is used with its long build-up time and but fair amplitude stability, for the short build-up time of the fork oscillator is all important with the stability of the fork amplitude important to a lesser extent, the wave shape obtained being by comparison a relatively minor factor.

Figures 2, 3, 4 and 6 are on a scale which is substantially twice that of the actual embodiments described above, the overall height of the housing 2 from the lower external ends of pins 9 to the closed top of the housing being some 5$\frac{3}{16}$ inches and the weight thereof a maximum of 10 ounces. The oscillator of my invention is thus particularly adapted for all airborne instrumentalities, such as bomb, rocket and gun sights and computers as also other applications where weight and spatial requirements are an essential consideration. The circuit is of such design as intrinsically to dispense with large components, principally capacitances, while at the same time meeting the most exacting requirements as to constancy, as well as rate, of response. In addition the assembly of the unit is such that the greatest facility in replacing units is thereby obtained. The compact and accurate oscillator of the first illustrative embodiment is particularly useful where the required life is such that several renewals of electron tube 3 are likely in the course of the required equipment life and where the external rate control 4 is necessary to permit exact adjustment of the frequency for purposes of synchronizing with other equipments or for adjusting against primary standards. Thus the rate of adjustment by resistor 4 thereof permits variation in the frequency of the fork of the order of 100 parts per million as has been stated, and the circuit is such that the rate changes may be made without materially changing the circuit and output voltages. The even more compact and equally accurate oscillator of the second embodiment is most useful where space requirements are extremely tight, where the unit is expendable as in missiles, where an environmental condition such as humidity is extreme and it is therefore most desirable to have the fewest possible exposed connections, or where the expected life is not greater than the expected life of tube 3, for example 500 to 1000 hours.

Figure 8:
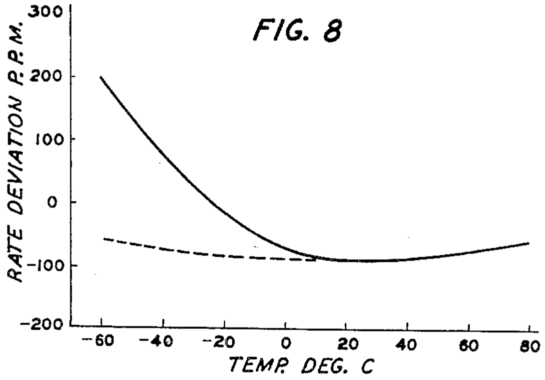
Figure 8 is a graph of the deviation of frequency with fork temperature.
Figure 9:
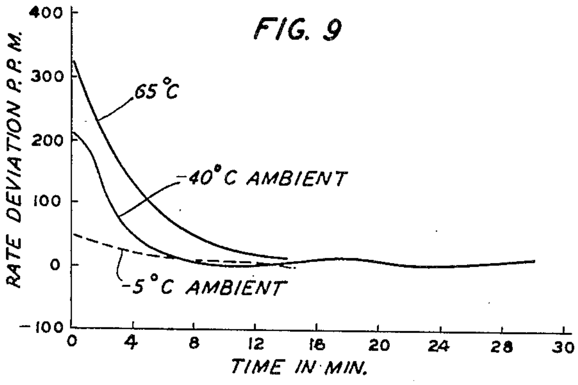
Figure 9 is a graph showing the time required to establish thermal equilibrium for various starting temperatures.
Figure 10:
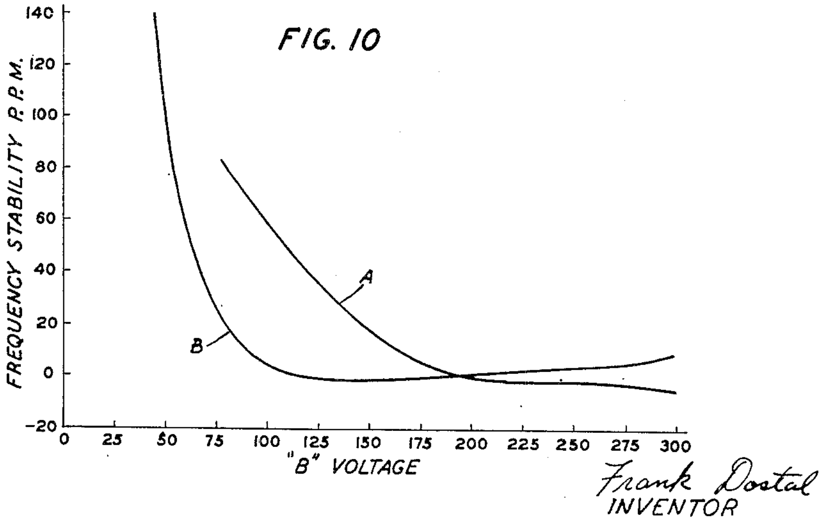
Figure 10 is a graph of plate voltage versus frequency stability.

The term "parts per million" has been used above, and the unit so termed has been used as one of the coordinates for the graphs of Figures 8, 9 and 10. This unit is a particularly convenient one to consider when dealing with the precise frequencies here involved. For example, if a nominal frequency of 400 cycles, a frequency readily obtainable by the oscillator of the instant invention, is fast by 20 parts per million its actual frequency is 400+400 (.00002) or 400.008 cycles, an error of approximately 2 seconds in twenty-four hours.

What is claimed is:

1. A tuning fork oscillator comprising an elongated cylindrical enclosure, a rectangular frame within the enclosure aligned with a diameter of the enclosure, the width and height dimensions of the frame being less than the internal diameter and height of the enclosure respectively, means supporting the frame at regions of the opposite smaller sides of the frame on the enclosure in spaced relation therewith at all other regions of the frame, a channel member resiliently supported by and within the frame in spaced relation thereto, a tuning fork supported on the channel member with its tines substantially parallel to the channel member and spaced from one face of the channel member, a driving coil, a pick-up coil, each coil being positioned between the tuning fork tines and the one face of the channel member, a magnetic core supported on the channel member extending through each coil with at least one pole of each core extending between the tuning fork tines, an electrical amplifying circuit comprising a plurality of elements and sources of potential and having input terminals connected to the pick-up coil and output terminals connected to the driving coil, an electrically insulating component board supported on the channel member face opposite the one face, the plurality of elements of the amplifying circuit being supported on the component board, a plurality of terminal pins extending through one end of the enclosure, electrical connections interconnecting the elements with respective pins of the plurality and the potential source, a predetermined pair of the plurality of pins being connected to the amplifier output whereby the amplified oscillations may be connected to a utilization circuit.

2. A tuning fork oscillator according to claim 1 in which an electrical heating coil is supported on the channel member in cooperative relation to the tuning fork, a thermostat is electrically connected to the heating coil and mechanically supported on the channel member, connections between the heating coil and a predetermined pair of the plurality of terminal pins, and a source of potential connected to said pair of terminal pins.

3. A tuning fork oscillator comprising an elongated cylindrical enclosure having an integral closed top and an open bottom, a rectangular frame within the enclosure aligned with its shorter arms along diameters of the enclosure, a closure member fitted into the open enclosure bottom, means rigidly supporting the frame by one shorter arm on the closure member in spaced relation to the closure member, means projecting from the closed enclosure top and engaging the other shorter arm of the frame to centralize the frame in the enclosure, a cradle having a U-shaped cross section parallel the shorter arms of the frame resiliently suspended from and within the frame in spaced relation thereto, a lateral projection integral with the cradle near one end thereof, a tuning fork having tines supported on the lateral projection so that its tines are parallel the length of the cradle and spaced frome one face of the cradle, a driving coil for actuating the tuning fork, a pick-up coil cooperating with the tuning fork, each coil being positioned in the space between the tuning fork tines and the one face of the cradle, an aligned pair of U-shaped magnetic cores affixed to the end region of the one face of the cradle remote from the lateral projection and having their poles extend between the tuning fork tines, each the driving and pick-up coil being wound about the outermost pole of the U of a respective core of the pair, an amplifying circuit comprising a first resistance in shunt of the pick-up coil, a first condenser in series with the pick-up coil, a control rheostat having two terminals, one terminal of the rheostat being connected to the first condenser, a second resistance connected in shunt to earth between the first condenser and the one rheostat terminal, the other rheostat terminal being connected to the first resistance, a tap on the rheostat between the two terminals, a double triode thermionic tube of which each triode has a cathode, a grid and a plate, the tap being connected to the grid of the first triode of the tube, a third resistance in series with the driving coil and the plate of the second triode of the tube, a second capacitance and a varistor in series connecting the plate of the second triode to the cathode of the first triode, a fourth resistance and a thermistor in parallel connected in shunt between the varistor and ground, a first source of potential adapted to heat the cathodes of both triodes, and a second source of potential connected to the plates of the first and second triodes, and an electrically insulating component board supported on the cradle face opposite the one face, the first, second, third and fourth resistances, the first and second capacitances, the varistor and the thermistor being supported on component board.

4. A tuning fork oscillator according to claim 3 in which the lateral projection is of heat conductive material, an electrical heating coil is supported by the projection, electrical connectors passing through the enclosure connect the heating coil to the first source of potential, and a thermostat mechanically supported on the projection is electrically adapted to close and open the connectors in accordance with the temperature prevailing within the enclosure in relation to a fixed temperature.

5. A tuning fork oscillator comprising an elongated cylindrical enclosure having an integral closed top and an open bottom, a rectangular frame within the enclosure aligned with its shorter arms along diameters of the enclosure, a closure member fitted into the open enclosure bottom, means rigidly supporting the frame by one shorter arm on the closure member in spaced relation to the closure member, means projecting from the closed top and slidingly engaging the other shorter arm of the frame to centralize the frame in the enclosure, an elongated cradle having a U-shaped cross-section parallel to the shorter arms of the frame, means resiliently supporting the cradle within the frame in spaced relation thereto, said resilient means comprising a hollow cylinder of resilient material having a pair of diametrically opposite projections from its outer surface adapted to engage registering ports in the frame and cradle, the outer diameter of the hollow cylinder being in excess of the spacing between the frame and the cradle whereby the cylinder is flattened to a degree when its projections engage said ports, a lateral projection integral with the cradle near one end thereof, a tuning fork having tines supported on the lateral projection so that its tines are parallel the length of the cradle and spaced from one face of the cradle base, a driving coil for actuating the tuning fork, a pick-up coil cooperating with the tuning fork, each coil being positioned in the space between the tuning fork tines and the one face of the cradle base, an aligned pair of U-shaped magnetic cores affixed to the end region of the one face of the cradle remote from the lateral projection and having their poles extend between the tuning fork tines, each of the driving and pick-up coils being wound about the outermost pole of the U of a respective core of the pair, an amplifying circuit comprising a plurality of passive elements and a thermionic tube of which the input is connected to the pick-up coil and the output to the driving coil, an electrically insulating board supported on the face of the cradle base opposite the one face on which at least the passive elements of the amplifying circuit are mechanically supported, a plurality of terminal pins passing through the closure member, and electrical connections from the amplifying circuit to respective pins of the plurality, the connections having a slack therein to assure permanency of the connection on vibration of the cradle and changes in physical dimensions thereof with temperature.

References Cited in the file of this patent

UNITED STATES PATENTS

| | | |
|---|---|---|
| 1,524,868 | Knoll | Feb. 3, 1925 |
| 1,880,923 | Eisenhour | Oct. 4, 1932 |
| 2,174,414 | Cooley | Sept. 26, 1939 |
| 2,346,984 | Mead | Apr. 18, 1944 |
| 2,549,807 | Heed | Apr. 24, 1951 |
| 2,574,188 | Murray | Nov. 6, 1951 |
| 2,583,542 | Bostwick | Jan. 29, 1952 |